United States Patent [19]

Ma

[11] Patent Number: 4,559,458
[45] Date of Patent: Dec. 17, 1985

[54] TEMPERATURE TRACKING AND SUPPLY VOLTAGE INDEPENDENT LINE DRIVER FOR ECL CIRCUITS

[75] Inventor: Bing-Fong Ma, San Francisco, Calif.

[73] Assignee: Advanced Micro Devices, Inc., Sunnyvale, Calif.

[21] Appl. No.: 597,618

[22] Filed: Apr. 6, 1984

[51] Int. Cl.[4] .............. H03K 19/086; H03K 19/013; H03K 17/14; H03K 17/04
[52] U.S. Cl. ................................. 307/455; 307/254; 307/270
[58] Field of Search ............... 307/443, 455, 467, 254, 307/270

[56] References Cited

U.S. PATENT DOCUMENTS

| | | | |
|---|---|---|---|
| 3,549,900 | 12/1970 | Yu | 307/455 |
| 3,806,736 | 4/1974 | Wilhelm | 307/455 |
| 3,978,347 | 8/1976 | Hollstein et al. | 307/455 |
| 4,276,485 | 6/1981 | Rydval | 307/455 X |
| 4,287,435 | 9/1981 | Cavaliere et al. | 307/455 X |
| 4,289,978 | 9/1981 | Konian et al. | 307/455 X |
| 4,347,446 | 8/1982 | Price | 307/455 X |
| 4,408,134 | 10/1983 | Allen | 307/455 X |

OTHER PUBLICATIONS

Chang et al., "Complementary Driver for Emitter-Coupled-Logic Gates", *IBM TDB;* vol. 19, No. 12, pp. 4614–4615; 5/1977.

Beranger et al., "Emitter Coupled Logic Gate with a Dual Current Source"; *IBM TDB;* vol. 24, No. 1B, pp. 511; Jun. 1981.

Dansky et al., "Current-Control Gate Push-Pull Dotting"; *IBM TDB;* vol. 24, No. 6, pp. 3031–3034; 11/1981.

*Primary Examiner*—Larry N. Anagnos
*Attorney, Agent, or Firm*—Patrick T. King; J. Vincent Tortolano

[57] ABSTRACT

An active pulldown means is provided for the output line of an ECL gate. The pulldown means utilizes a Wilson current mirror as a differential-to-single ended converter in a transition detection arrangement which tracks temperature variations and rejects supply voltage transients in order to ensure correct operation under all conditions. The desired and the present output conditions are compared in the detection scheme. High transient current is supplied to the output only when the two output conditions do not match for output high-to-low transitions.

11 Claims, 12 Drawing Figures

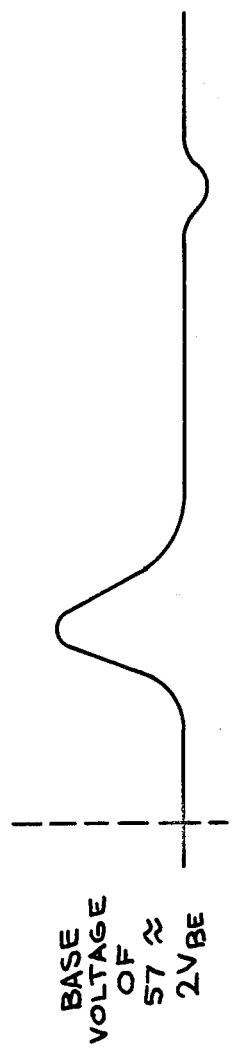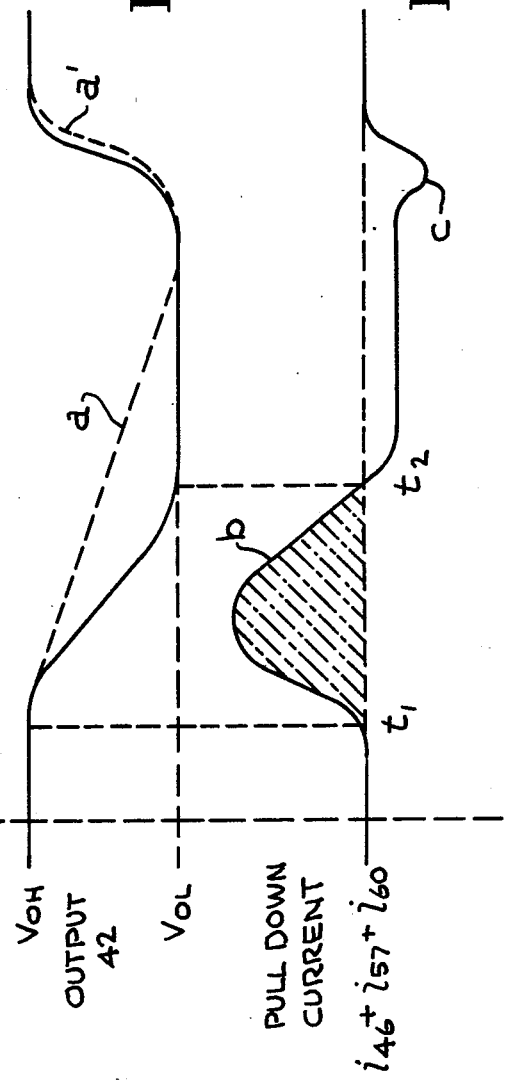

4,559,458

TEMPERATURE TRACKING AND SUPPLY VOLTAGE INDEPENDENT LINE DRIVER FOR ECL CIRCUITS

BACKGROUND OF THE INVENTION

1. Field of the Invention

This invention relates to an improved line driver for ECL circuits and, more particularly, relates to a pulldown transistor arrangement for ECL output metal interconnect lines which functions independent of temperature and supply voltage variations.

2. Discussion of Background and Prior Art

Due to the exponential current-voltage characteristics and large transconductance of bipolar transistors, bipolar transistors are especially suitable for driving large capacitive loads. Although modern MOSFETs and bipolar transistors have approximately the same ring oscillator frequencies, it is the large driving capability of the bipolar transistors that accounts for the dominance of bipolar technology in high-speed VLSI applications. Because of its non-saturating nature and high functional capability, emitter-coupled logic has found widespread use in high performance circuits. In order to optimize overall circuit performance and take full advantage of bipolar devices over MOSFETs, it is important to enhance the driving capability of the ECL gates. For such ECL gates the low-to-high transition time is generally not a limitation because the output emitter followers are essentially not current limited and are capable of pulling the output line up to 1-2 ns. In high density integrated circuits high load capacitances of up to 1-10 pf may be experienced due to the cumulative length of all lines connected to the output, especially for large fan-outs. See, e.g., A. H. Dansky, "Halving Load Resistances Shortens Long Path Delays", *Electronics,* Oct. 9, 1980, p. 146. In a standard ECL gate, the output line is discharged via a constant pull-down current source during high-to-low transitions on the output line. Since the dc pulldown current is limited by power dissipation considerations, the high-to-low transition time on the output can be significant, especially when a heavy load is driven.

In the prior art the long high-to-low transition times described above have been tolerated or else active means have been utilized to pull down the output lines, i.e., to withdraw the charge held on the parasitic capacitance of the interconnect line. For example, in J. E. Price, "Emitter-Coupled Logic Circuit", U.S. Pat. No. 4,347,446, an active pulldown arrangement is proposed which comes into effect when high-to-low transitions are taking place. This approach requires a separate power supply and does not function in a manner which is independent of temperature variations or operate independent of supply voltage.

It is an object of the present invention to provide an active pulldown means for the output line of an ECL gate which operates over the full military temperature range independently of changes in temperature.

It is another object of the present invention to supply an ECL compatible line driver which does not require a separate power supply and operates independent of variations in the existing supply voltage.

BRIEF DESCRIPTION OF THE DRAWINGS

For a more complete understanding of the present invention, reference may be had to the accompanying drawings which are incorporated herein by reference and in which:

FIGS. 7a–7f are diagrams showing the critical voltages or currents in the circuit of FIG. 3.

SUMMARY OF THE INVENTION

An active pulldown means is provided to drive the output line of an ECL gate. The pulldown means is controlled by transition detection circuitry in which a Wilson current source is used as a part of the differential-to-single ended conversion and supply voltage cancellation scheme. A temperature tracking controlling voltage for the Darlington pulldown device is produced by means of current summation at the base of the device. Increased current is supplied by the Darlington transistor during high-to-low transitions to the load, thereby reducing the high-to-low transition times.

DESCRIPTION OF THE PREFERRED EMBODIMENTS

The design objective for ECL circuits is to perform logic operations with the shortest possible propagation delay with a given dc power dissipation. As the number of gates increases, the supply current per gate will have to be reduced because of power dissipation considerations. Reduced power dissipation per gate and long interconnect lines in VLSI circuits suggests the requirement of some kind of dynamic pulldown arrangement to shorten the high-to-low transition time without increasing the dc power dissipation per gate. Prior art pulldown circuits have reduced the contribution to propagation delay due to the high-to-low transition time by utilizing a pulldown current transistor which draws a low dc standby current yet is capable of supplying high transient current to discharge the load capacitance. However, the prior art pulldown arrangement is susceptible to voltage supply and temperature variations. Voltage variations on the supply lines may be erroneously interpreted by the circuit as signalling the requirement of a large transient current normally needed only during high-to-low transitions, thereby resulting in unnecessary power dissipation. Supply voltage variations not only result from deviations from nominal but are also caused by local supply transients due to the switching current in a VLSI circuit. Extreme temperatures may also cause the circuit to operate incorrectly. It is therefore necessary to modify the prior art circuit so that the pulldown transistor operates independent of the supply voltages. A temperature tracking scheme is also required to ensure correct operation over the entire military temperature range. The pulldown circuit of the present invention achieves temperature independent operation, reduces high-to-low propagation delay without increasing dc power dissipation and eliminates dependence on variations in supply voltage.

Figure 1:
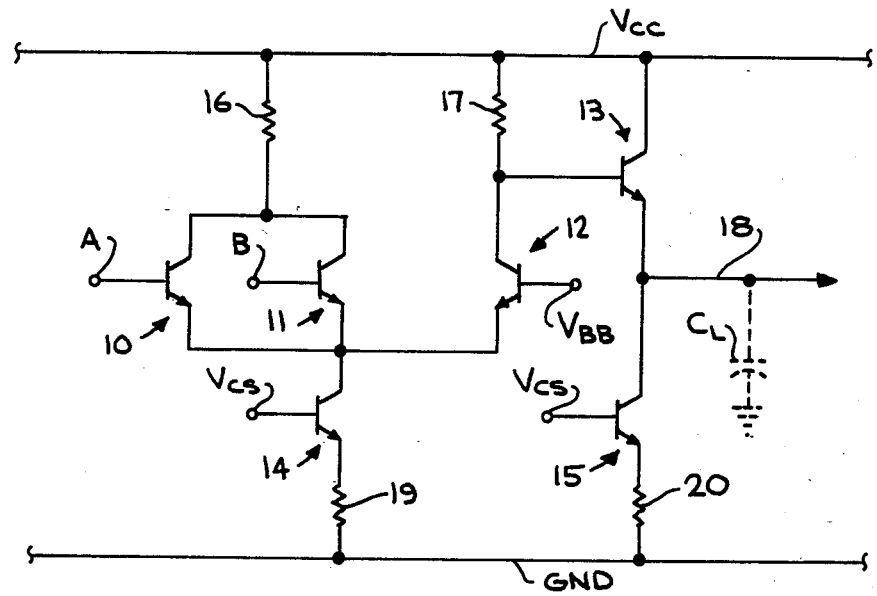
FIG. 1 is a simplified circuit schematic of an ECL gate of the prior art.
Figure 7A:
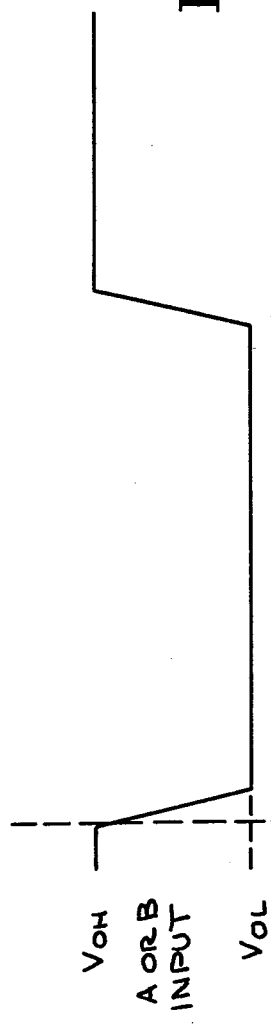
Figure 7B:
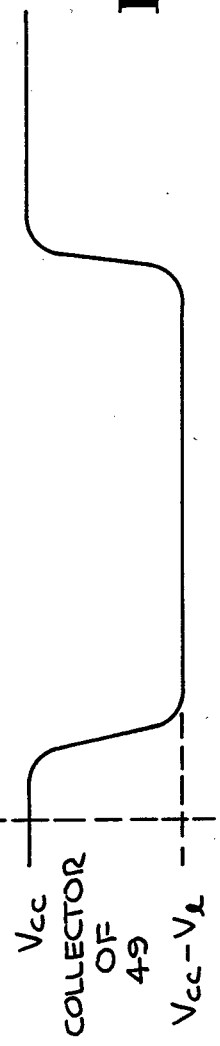
Figure 7C:
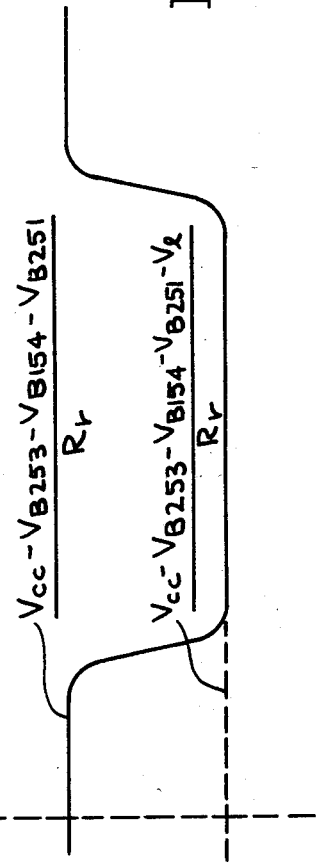

A prior art ECL gate is shown in FIG. 1. Here, an OR output is available on output line 18 which is connected to the emitter of emitter follower 13. The circuit operation and logic function of this ECL gate is well known in the art. Briefly, input signals are provided, respectively, to the bases of input transistors 10 and 11. Reference transistor 12 has a reference voltage $V_{BB}$ applied on its base, the reference voltage $V_{BB}$ being midway between the voltage for a logic 1 and the voltage for a logic 0 for either of the input signals A or B. Current for driving the logic operations of the gate is provided by a current source consisting of transistor 14 and resistor 19. The base of transistor 14 is controlled by the bandgap reference voltage, $V_{CS}$, commonly available on ECL circuits. This current will be steered between resistors 16 and 17 depending upon the voltage levels, i.e., the logic states, of the signals A and B. When current flows through resistor 17, i.e., when both inputs A and B are low, the voltage on the base of emitter follower 13 will be low and the output line 18 is low. When no current flows through resistor 17, i.e., when either A or B is high, the voltage on the base of emitter follower 13 will be at the voltage supply $V_{CC}$ level; then the OR output on line 18 will be high. As seen in FIG. 7e, the low-to-high transition in an ECL gate is relatively short, on the order of 1-2 ns since emitter follower 13 is connected directly to the $V_{CC}$ supply voltage and is not current limited. Changes in the voltage at its base which occur in accordance with the input logic control this essentially unlimited current. However, this high-to-low transition time is several times as long, since load current source transistor 15 has a constant base voltage, the bandgap reference voltage $V_{CS}$, and there is no increase in the current through transistor 15 or resistor 20 when it is desired to pull output line 18 down. The pulldown current is constant and limited in magnitude due to consideration of power dissipation. The output line will be pulled low at a rate determined by the constant current through transistor 15. The charge to be removed from the parasitic interconnect capacitance during a high-to-low transition at the output is $$C_L(V_{OH}-V_{OL})$$

where
$V_{OH}$=high outut
$V_{OL}$'low outut
The time required for a given current, i, to remove this charge is $$[C_c(V_{OH}-V_{OL})]/i$$

Since $C_L$ is likely to be large for VLSI circuits and pulldown current, i, is limited, an appreciable amount of time is required to pull the output line 18 to the logic low level, $V_{OL}$.

Figure 2:
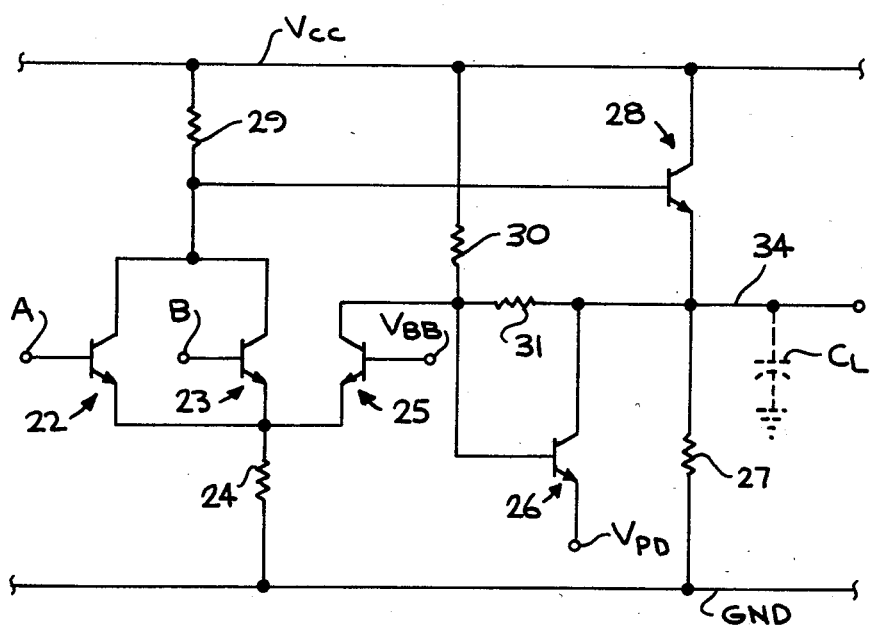
FIG. 2 is a circuit diagram of a prior art active pulldown means for an ECL gate.

A prior art approach to reducing the high-to-low transition time in accordance with U.S. Pat. No. 4,347,446 is shown in FIG. 2. Here, the charge held by parasitic line capacitance $C_L$ on output line 34 is withdrawn principally through pulldown transistor 26. Transistor 26 is conductive only when output line 34 undergoes a high-to-low transition Transistors 25, 28 and resistors 30 and 31 form a transition detection arrangement. When output 34 is at the dc logic high level, $V_{OH}$, or at the dc logic low level, $V_{OL}$, the transition detection arrangement biases the transistor 26 just out of conduction. During output high-to-low transition, current through resistor 24 is steered away from transistor 25. Meanwhile, output line 34 is still held high by the parasitic capacitance $C_L$. Reduction of current in transistor 25 and the logic high voltage at the output cause the transition detection arrangement to increase the voltage at the base of the pulldown transistor 26. This increased bias at the base of transistor 26 is sufficient to put it into conduction, thereby supplying dynamically increased pulldown current for the output and reducing the transition time. The main feature of the prior art circuit is low dc standby current but high transient current on demand.

Figure 3:
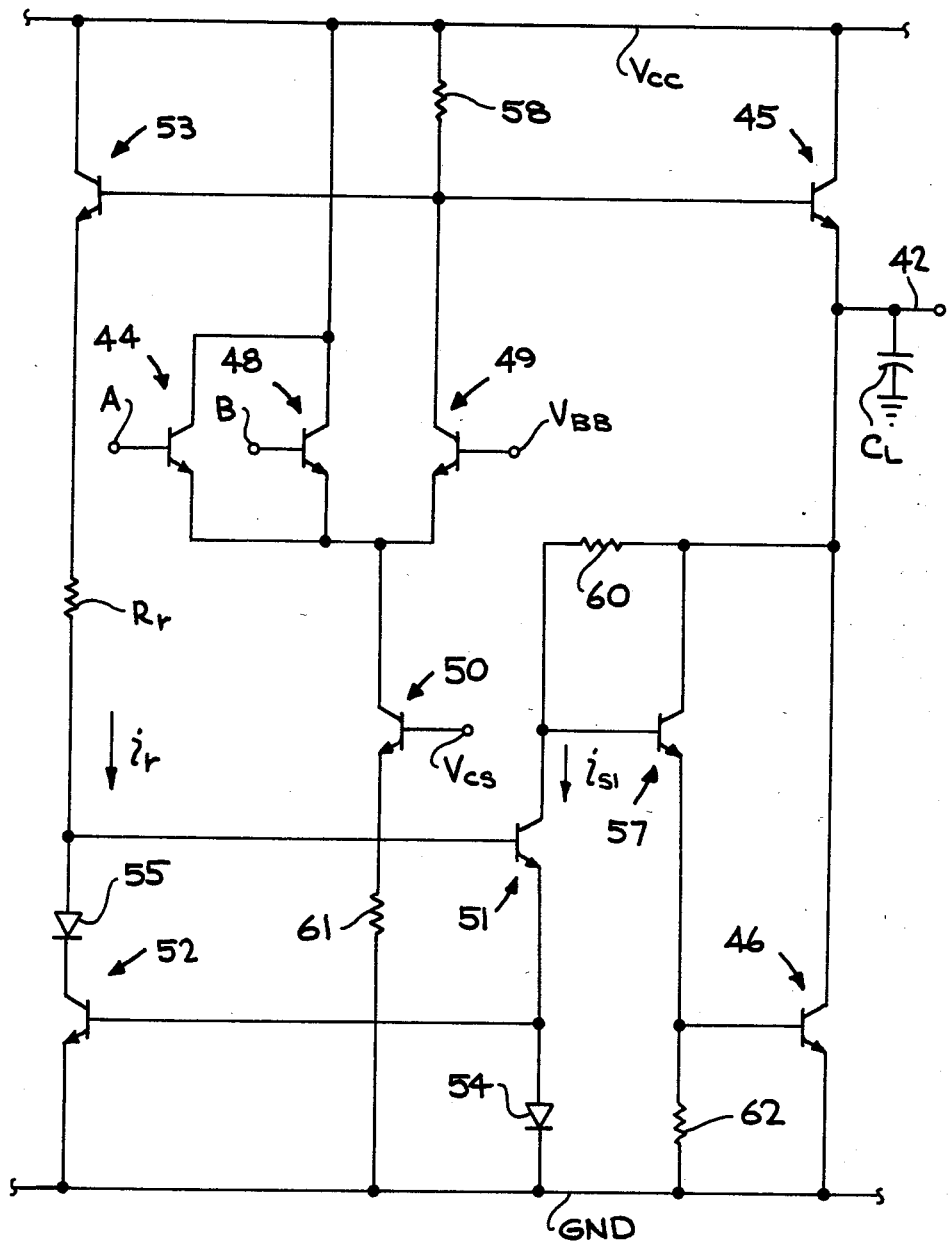
FIG. 3 is a circuit schematic of the line driver of the present invention in combination with an ECL gate circuit.

The circuit of the present invention improves the active pulldown scheme described above. No separate power supply is required. In addition, temperature and voltage supply insensitivity is obtained. In FIG. 3 the standard elements of an ECL gate are shown in conjunction with the line driver of the present invention. Input transistors 44 and 48 have the input signals A and B applied to their bases, respectively. Reference transistor 49 has the reference voltage $V_{BB}$ applied to its base. Current from current source 50 and resistor 61 is steered among reference transistor 49 and the input transistors 44 or 48. An OR output is available on output line 42. The line parasitic capacitance $C_L$ is shown attached to the output line 42. Emitter follower 45 serves to pull up output line 42 and charges the capacitance $C_L$. The pulldown devices 46 and 57 supply a dc standby current to the output line 42.

In distinction to the prior art circuit of FIG. 2, the circuit of the present invention will not operate erroneously due to temperature variations or supply line transients, i.e., it will not incorrectly interpret supply and temperature variations as the occurrence of high-to-low transitions at the output. Similar to the prior art circuit of FIG. 2, the present invention consists of a transition detection circuitry which biases transistors 46 and 57 into heavy conduction only during high-to-low transition at the output. At dc steady state, transistors 46 and 57 supply low standby current to reduce dc power dissipation. The present invention therefore provides an adaptive and additive pulldown current to the output.

The principle of operation of the circuit of the present invention may be understood by comparing the circuit schematic of FIG. 3 with the timing diagrams of FIGS. 7a-7f. The timing diagrams illustrate, respectively, the input voltages, the voltage level on the collector of transistor 49, the reference current $i_r$ and the mirrored current $i_{51}$, the base voltage on the pulldown transistor, the voltage on the output line and the collective pulldown current through transistors 57 and 46. By comparing FIG. 7a with FIG. 7b it can be seen that for both high-to-low transitions and low-to-high transitions at the output 42 the voltage transients at the collector of transistor 49 is faster than that of the output 42. The difference is due to the limited charge and discharge rate of $C_L$. The delay on high-to-low transitions is much more pronounced than low-to-high transitions. The transient differential voltage between the output line 42 and the emitter of transistor 53 is used to control the Darlington pair 57, 46. The collector of transistor 49 is tied to the base of emitter follower 53 through which a current $i_r$ flows. As the collector voltage on transistor 49 increases, $i_r$ also increases and vice versa. Thus, the current $i_r$ contains the desired output information. The Wilson current mirror arrangement consisting of transistors 51 and 52 and diodes 54 and 55 is used as a differential-to-single ended converter. The mirrored current $i_{51}$ is passed through resistor 60. Since the output 42 lags behind the collector voltage of the transistor 49, the voltage produced at the base of the transistor 57 contains the desired and the present output information. If the desired output and the present output do not match, then a transient pulse will be produced at the base of transistor 57. When the output voltage at 42 is lower than the emitter voltage of transistor 53, both $i_r$ and $i_{51}$ are high so that the base of transistor 57 is biased at a voltage lower than its standby value. Under this condition, i.e. when a low-to-high transition is taking place, the transient current through the Darlington transistors 57 and 46 will be slightly reduced, as shown by dip c in FIG. 7f. When the collector of the transistor 49 undergoes a high-to-low transition, the mirrored current $i_{51}$ decreases. Since the output is still held high by $C_L$, the reduced current $i_{51}$ will be less than what is required to bias the summing node (base of transistor 57) at 2 $V_{BE}$(on). As a result, the summing node voltage rises above its dc value. Increased pulldown current is therefore drawn from $C_L$, as seen by rise b in FIG. 7f. The reduction in propagation delay for the high-to-low transition can be seen in FIG. 7(e) by comparing the solid line with the dotted line. Once the voltages of the output 42 and the collector of transistor 49 reach their steady-state values, the base bias of the transistor 57 returns to its dc value of 2 $V_{BE}$(on). The transient pulldown current also returns to zero. Essentially, the principle described is that of detecting a high-to-low transition using a Wilson current mirror as a differential-to-single ended converter to control the current in the pulldown transistor.

Temperature tracking behavior and $V_{CC}$ independence of the transition detection circuitry is obtained by using a Wilson current mirror consisting of transistors 51 and 52 and diodes 54 and 55. See, e.g., Gray & Meyer, "Analysis and Design of Analog Integrated Circuits", pp. 208–210 (Wiley 1977). The transistor combination of transistors 46 and 57 operate as a Darlington pair. Since the magnitude of the pulldown current is determined by the voltage between the base of the transistor 57 and the ground, the voltage should have no $V_{CC}$ dependence to ensure correct operation when supply voltage transients occur. Now, the dc steady state base voltage of transistor 57 should be two base-emitter drops above ground; see, for example, the baseline level in FIG. 7d. Since base-emitter drop, $V_{BE}$, varies with temperature, the controlling voltage of the pulldown circuit is required to have the same temperature dependence as $V_{BE}$. The supply independence and temperature tracking behavior is established by passing a supply and temperature dependent current through resistor 60 into a summing node at the base of transistor 57. Another supply and temperature dependent current $i_{51}$ is withdrawn from the same summing node. The current through resistor 60 and the current $i_{51}$ are designed such that they have identical $V_{CC}$ dependence but different $V_{BE}$ dependence. The $V_{CC}$ dependence is cancelled at the summing node. Incomplete compensation of the $V_{BE}$ dependence establishes the desired dc bias voltage at the summing node as described above. This dc bias voltage at the base of the transistor 57 is approximately the same to the first order regardless of the output logic state. Details of the compensation scheme are described subsequently in the circuit equations.

The current $i_r$ is defined by the collector voltage on reference transistor 49, the base-to-emitter drops of transistors 53 and 51, the drop across diode 54 and the value of resistor $R_r$. The Wilson current mirror not only supplies the supply and temperature dependent current $i_{51}$ into the summing node for the purpose of supply compensation, it also serves as a level shifter. As described below with reference to the relevant equations, this dependence is removed by selecting the value for $R_r$ to be equal to the value for the resistor 60. The equation which determines the current $i_r$ is given by:

$$i_r = \frac{V_{C49} - V_{BE51} - V_{BE54} - V_{BE53}}{R_r} \tag{1}$$

where $V_{C49}$ = collector voltage on transistor 49
$R_r$ = value of the resistor $R_r$ and
$V_{BEn}$ = the base-to-emitter voltage of the n'th transistor.

Now it is shown that in a Wilson current mirror $$i_{51} = \frac{i_r}{1 + \frac{2}{\beta_F^2 + 2\beta_F}} \tag{2}$$

where $\beta_F$ = transistor common emitter forward current gain.
The current through resistor 60 is the sum of the current through transistor 51 and the base current of transistor 57. Thus, $$i_{R60} = i_{51} + i_{B57} \tag{3}$$

where $i_{R60}$ = current through resistor 60
$i_{C51}$ = collector current in transistor 51 and
$i_{B57}$ = base current in transistor 57
so that $$i_{R60} = \frac{i_r}{1 + \frac{2}{\beta_F(\beta_F + 2)}} + \frac{\frac{V_{BE46}}{R_{62}} + \frac{i_{C46}}{\beta_F}}{\beta_F + 1} \tag{4}$$

$$\approx i_r \left[1 - \frac{2}{\beta_F^2}\right]^{-1} + \frac{i_{C46}}{\beta_F^2} + \frac{V_{BE46}}{R_{62}(\beta_F + 1)} \tag{5}$$

$$\approx i_r \left[1 - \frac{2}{\beta_F^2}\right] + \frac{i_{C46}}{\beta_F^2} + \frac{V_{BE46}}{R_{62}\beta_F} \tag{6}$$

Since the dc voltage at the base of transistor 57 is necessarily one base-to-emitter drop plus the drop of the voltage across resistor 60 below the collector voltage of transistor 49, $$V_{B57} = V_{C49} - V_{BE45} - i_{R60}R_{60} \tag{7}$$

$$= V_{C49} - V_{BE45} - \frac{V_{BE46}R_{60}}{\beta_F R_{62}} - \frac{i_{C46}R_{60}}{\beta_F^2} + \frac{2i_r R_{60}}{\beta_F^2} - i_r R_{60} \tag{8}$$

By substituting equivalent terms from these equations and by selecting the value of $R_{60}$ to be equal to the value of $R_r$, we obtain $$V_{B57} = (2V_{BE51} - V_{BE45} + V_{BE53}) - \quad (9)$$
$$\frac{1}{\beta_F} \frac{V_{BE46}R_r}{R_{62}} + \frac{1}{\beta_F^2} \times$$
$$2(V_{C49} - V_{BE51} - V_{BE53}) - i_{C46}R_r$$

When either input is at the logic high level $$V_{C49} = V_{CC}.$$

Under this condition, the base voltage of transistor 57 is $$V_{B47H} = (2V_{BE51} - V_{BE45} + V_{BE53}) - \quad (10)$$
$$\frac{1}{\beta_F} \frac{V_{BE46}R_r}{R_{62}} + \frac{1}{\beta_F^2} \times$$
$$2(V_{CC} - 2V_{BE51} - V_{BE53}) - i_{C46}R_r$$

When the output is at the low logic level $$V_{C49} = V_{CC} - V_L$$

where $V_L$ is the logic swing of the ECL gate. The dc bias voltage at the base of transistor 57 for the output low level condition is therefore given by $$V_{B47L} = (2V_{BE51} - V_{BE45} + V_{BE53}) - \frac{V_{BE46}R_r}{\beta_F R_{62}} + \frac{1}{\beta_F^2} \times \quad (11)$$
$$2(V_{CC} - 2V_{BE51} - V_{BE53} - V_L) - i_{C46}R_r$$

If $\beta_F$ is large enough from the process used to fabricate the ECL parts, then $$V_{B57H} = V_{B57L} = 2 V_{BE}$$

where
$V_{B57H} = V_{B57}$ when either input is high
$V_{B57L} = V_{B57}$ when both inputs are low.

As a consequence, the dc bias voltage at the base of transistor 57 is always approximately $2 V_{BE}$ and is independent of both the logic state and the supply voltage. Temperature dependence is reduced to that of $V_{BE}$. The use of the Wilson current mirror is now evident. Instead of resulting in a term $2 V_{CC}/\beta_F$ which would result if a conventional current mirror were used, the Wilson configuration reduces the $V_{CC}$ dependence to $2 V_{CC}/\beta_F^2$, a smaller term.

Figure 4:
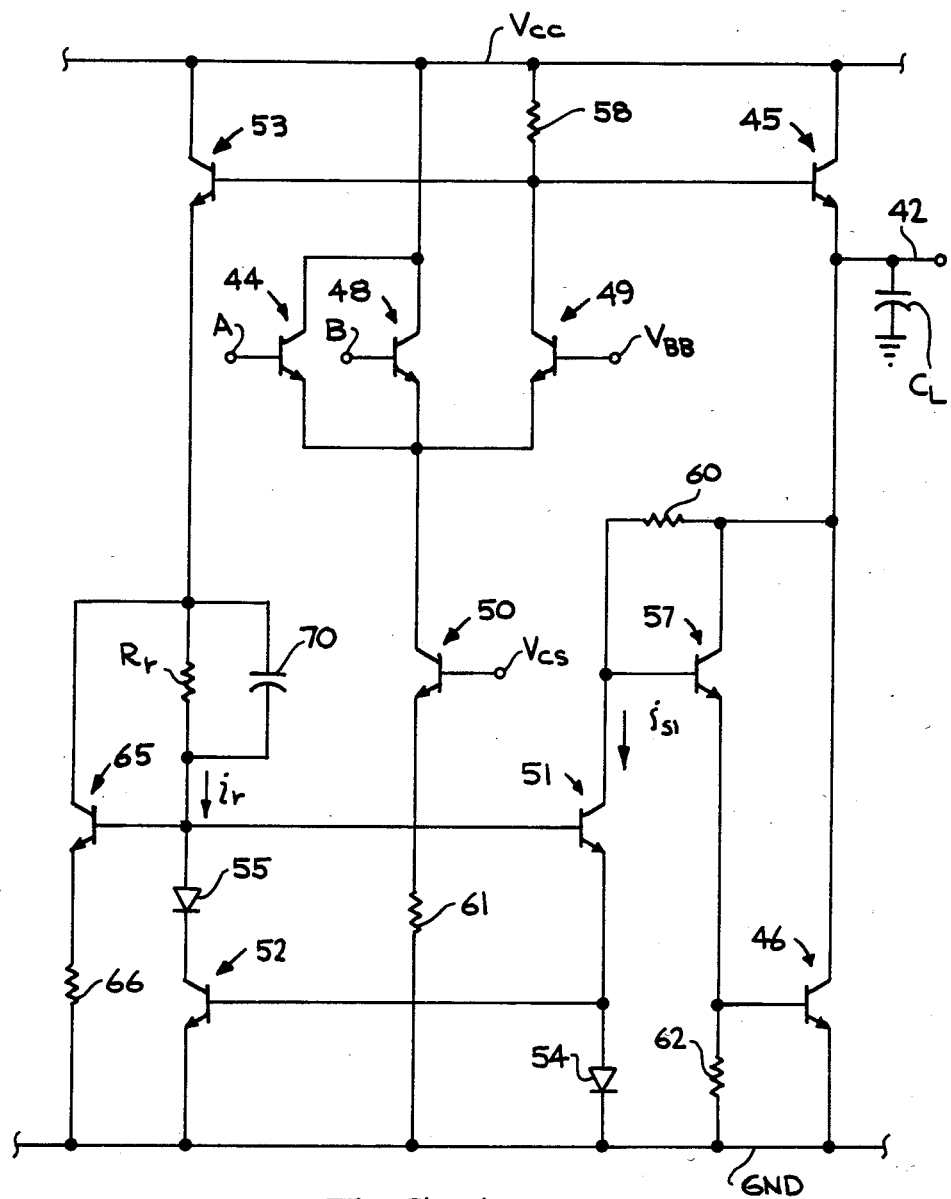
FIG. 4 is a circuit schematic of a preferred embodiment of the line driver of the present invention in combination with an ECL gate circuit.

When $\beta_F$ is not large enough, the error term $$\frac{V_{BE46}R_r}{\beta_F R_{62}}$$

can be compensated by using the embodiment shown in FIG. 4. The component string of transistors 65 and resistor 66 balances the effect of the component string consisting of transistor 57 and resistor 62. Transistor 65 compensates for the error introduced by the base current of transistor 57. In the preferred embodiment transistor 65 is identical to transistor 57 and resistor 66 is identical to resistor 62.

As the input undergoes a high-to-low transition, the voltage at the collector of transistor 49 goes from the level of $V_{CC}$ to the level of $V_{CC} - V_L$. At the same time, the line capacitance, $C_L$, tends to hold the voltage on the collector of transistor 57 high. The reduction in $i_r$ and $i_{51}$ causes the voltage on the base of transistor 57 to rise above its dc bias value. The increased transient current through transistor 46 speeds up the high-to-low transition at the output. After the output has settled at the low logic value, the voltage on the base of transistor 51 returns to its dc bias value. The transistor 46 then conducts the standby dc pulldown current for emitter follower 45.

In the embodiment of FIG. 4, the capacitor 70 is added in parallel to the reference resistor $R_r$. It serves as a bypass capacitor to speed up the transient response at the base of transistor 57.

Figure 5:
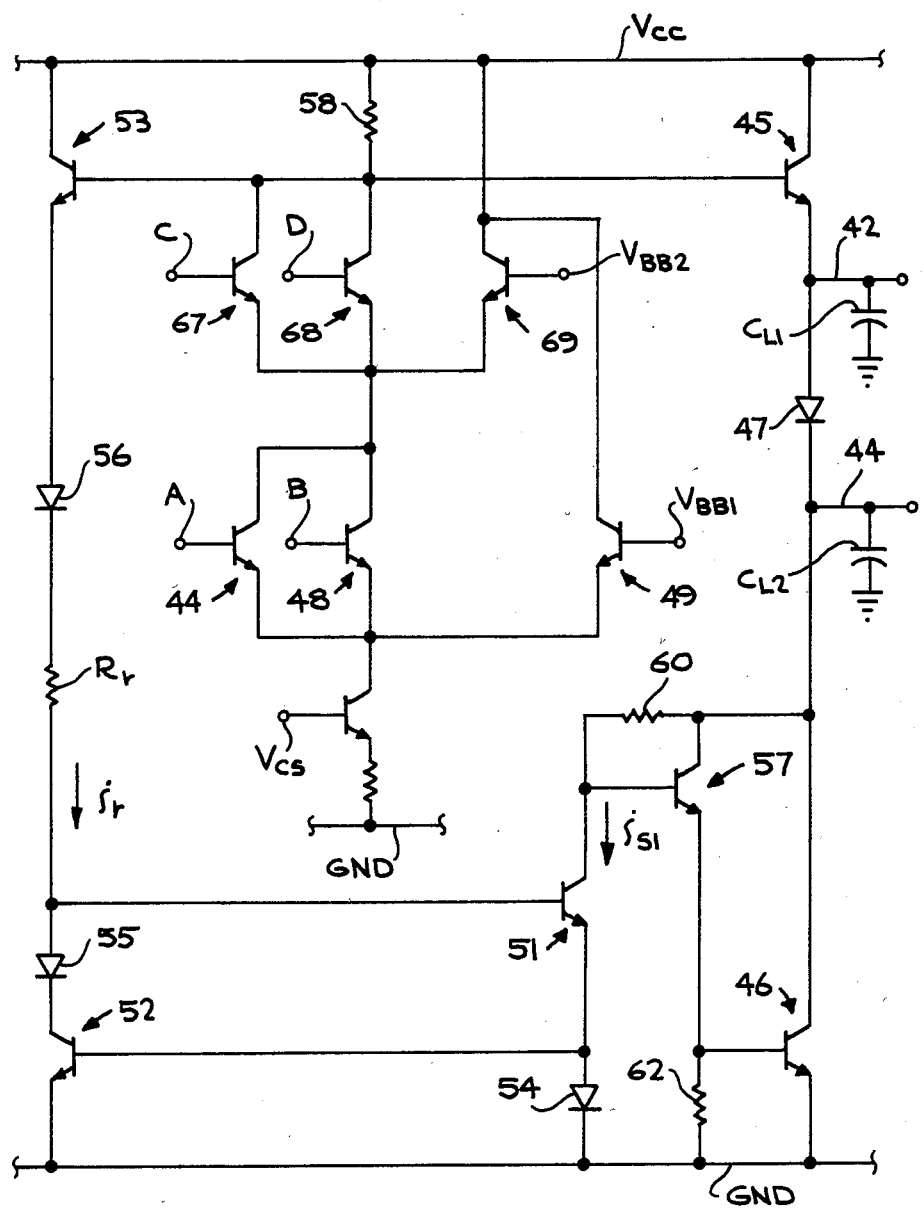
FIG. 5 is a circuit schematic of an embodiment of the present invention suitable for ECL series gated logic.

The temperature tracking and supply voltage line driver of the present invention is also useful for series-gated schemes. Thus, as shown in FIG. 5, a dual level logic ECL gate is used in conjunction with the transition detection and adaptive pulldown scheme. Here, the diode 47 attached to the emitter of emitter follower 45 gives the second level of logic. Thus, a first level of logic is available on output line 42 and a second level of logic is available on output line 44. To compensate the temperature coefficient in diode 47, another diode 56 is used in the component string that produces the reference current, $i_r$. The active pulldown circuit functions otherwise as described above with respect to the conventional embodiment.

Figure 6:
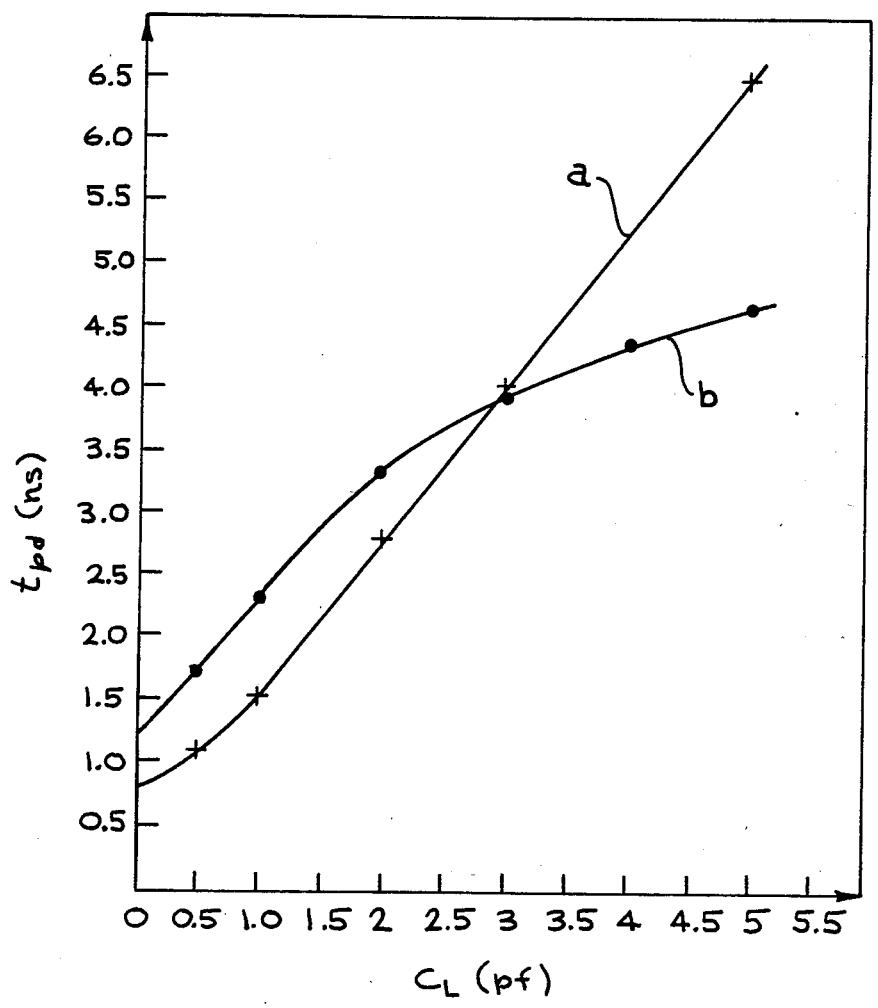
FIG. 6 is a computer simulation showing the pulldown time as a function of parasitic line capacitance for a standard ECL gate and an improved ECL gate with active pulldown in accordance with the present invention.

The foregoing description of a preferred embodiment of the line driver has been presented for purposes of illustration and description. The advantage of reduced high-to-low transition times, $t_{pd}$, for appreciable capacitive loads is seen by comparing the plateau shape of line b in the computer simulation of FIG. 6 with line 6a for a standard ECL gate. The description is not intended to be exhaustive or to limit the invention to the precise form disclosed, and obviously many modifications and variations are possible in light of the above teaching. The circuit embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A temperature tracking and supply voltage independent line driver for an ECL gate, comprising:
   circuit means for detecting transitions on the output line of said ECL gate and generating a reference current in response to the detection of transitions in said ECL gate, said reference current reflecting the desired output on said ECL gate; and
   Wilson current mirror means for mirroring said reference current and for differential-to-single ended conversion, said mirrored current being applied to said line driver whereby the current drawn by said line driver is increased during high-to-low transitions.

2. A temperature tracking and supply voltage independent line driver in accordance with claim 1 wherein said line driver commprises a Darlington pulldown arrangement and wherein said reference current is higher than required to bias said Darlington pulldown arrangement at its steady-state dc standby value during a low-to-high transition and wherein said reference current is lower than required to bias said Darlington pair at its dc steady-state value during a high-to-low transition whereby the current drawn by said pulldown arrangement is increased during high-to-low transitions.

3. A temperature tracking and supply voltage independent line driver in accordance with claim 2 wherein said Darlington pair includes:
- a first transistor having its collector connected to said output line and its emitter connected to the ground line;
- a second transistor having its collector connected to said output line, having its emitter connected to the base of said first transistor and through a pulldown resistor to ground, and having its base connected to the output side of said Wilson current mirror; and
- a resistor connected between said collector and said base of said second transistor.

4. A temperature tracking and supply voltage independent line driver in accordance with claim 3 wherein said Wilson current mirror comprises
- a first component string containing a first diode and first bipolar transistor connected in series, the emitter of said first bipolar transistor being connected to ground, the input to said first diode being connected to said reference current; and
- a second component string containing a second bipolar transistor and a second diode in series, the base of said second transistor being connected to said input to said first diode in said first string, the input to said second diode being connected to the base of said first transistor, the other terminal of said second diode being connected to ground and the collector of said second transistor providing the mirrored current to the line driver.

5. A temperature tracking and supply voltage independent line driver in accordance with claim 4 wherein said circuit means for detecting transitions and generating a reference current comprises
- a bipolar transistor having its base connected to the collector of the reference transistor or the collector of the input transistors of said ECL gate and having its collector connected to the $V_{CC}$ supply line and
- a reference resistor connected between the emitter of said transistor and said first diode in said first component string of said Wilson current mirror.

6. A temperature tracking and voltage independent line driver in accordance with claim 5 in combination with a bypass capacitor connected in parallel across said reference resistor to improve the transient response at the base of said second transistor.

7. A temperature tracking and supply voltage independent line driver in accordance with claim 5 in combination with additional error compensation circuitry connected in parallel with said first component string of said Wilson current mirror, said additional error compensation circuitry comprising a bipolar transistor having its collector connected to the node between the emitter of said bipolar transistor and said reference resistor, $R_r$, having its base connected to the node between said reference resistor and said first diode in said first component string and having its emitter connected through a resistor to ground.

8. A temperature tracking and voltage supply independent line driver in accordance with claim 5 wherein said reference transistor $R_r$ is equal in value to said resistor connected between said collector and said base of said second transistor in said Darlington pulldown arrangement.

9. A temperature tracking and supply voltage independent line driver in accordance with any one of claims 3-8 wherein said ECL gate is part of a series-gated structure and wherein said collector of said first transistor in said Darlington pulldown arrangement is connected to the lowest level output line.

10. A temperature tracking and supply voltage independent line driver in accordance with claim 3 wherein said steady-state dc level on the base of said second transistor is approximately 2 $V_{BE}$.

11. A temperature tracking and supply voltage independent line driver in accordance with claim 3 wherein all bipolar transistors are NPN bipolar transistors.

* * * * *